United States Patent

Lübbe et al.

[11] Patent Number: 6,111,965
[45] Date of Patent: Aug. 29, 2000

[54] METHOD AND APPARATUS FOR OFFSET COMPENSATION OF A SIGNAL PROCESSING CIRCUIT

[75] Inventors: Jürgen Lübbe, Jacobneuharting; Peter Kirchlechner, Hohenthann; Jörg Schambacher, München, all of Germany

[73] Assignee: STMicroelectronics GmbH, Grasbrunn, Germany

[21] Appl. No.: 08/900,322

[22] Filed: Jul. 25, 1997

[30] Foreign Application Priority Data

Jul. 26, 1996 [DE] Germany ................ 196 30 396

[51] Int. Cl.$^7$ .................. H04B 15/00; G01R 19/00; H03F 1/14; H03F 3/45
[52] U.S. Cl. .................. 381/94.5; 330/2; 330/51; 330/259; 327/307; 381/123
[58] Field of Search .................. 381/94.5, 71.1, 381/71.3, 123, 73.1; 330/2, 9, 51, 259; 327/307

[56] References Cited

U.S. PATENT DOCUMENTS

| | | | |
|---|---|---|---|
| 4,356,450 | 10/1982 | Masuda | 330/9 |
| 4,494,212 | 1/1985 | Muellner | 364/571 |
| 5,046,107 | 9/1991 | Iwamatsu | 381/107 |
| 5,061,900 | 10/1991 | Vinn | 330/9 |
| 5,584,059 | 12/1996 | Turney et al. | 455/126 |
| 5,789,974 | 8/1998 | Ferguson, Jr. et al. | 330/2 |

FOREIGN PATENT DOCUMENTS

| | | |
|---|---|---|
| 0065339A1 | 11/1982 | European Pat. Off. . |
| 0297818A2 | 1/1989 | European Pat. Off. . |
| 61-52012 | 3/1986 | Japan . |
| 2215931 | 9/1989 | United Kingdom . |

OTHER PUBLICATIONS

SGS–Thomson Microelectronics TDA7340, "Audio Signal Processor," pp. 1–18, Jan. 1995.

*Primary Examiner*—Forester W. Isen
*Assistant Examiner*—Brian Tyrone Pendleton
*Attorney, Agent, or Firm*—Theodore E. Galanthay; Robert Iannucci; Seed IP Law Group PLLC

[57] ABSTRACT

A method for offset compensation of a signal processing circuit in whose signal path a circuit configuration with offset is disposed, wherein the circuit configuration with offset is temporarily decoupled from the signal path of the signal processing circuit and meanwhile held strictly in a dc mode; a compensating dc voltage is added to the output dc voltage occurring at the output of the circuit configuration with offset in the dc mode, said compensating dc voltage being varied until the cumulative value of output dc voltage and compensating dc voltage has became zero; the circuit configuration with offset is then coupled into the signal path again; and from then on the compensating dc voltage occurring at the cumulative value zero is permanently added to the output signal of the circuit configuration with offset until a new offset compensating process is performed.

17 Claims, 2 Drawing Sheets

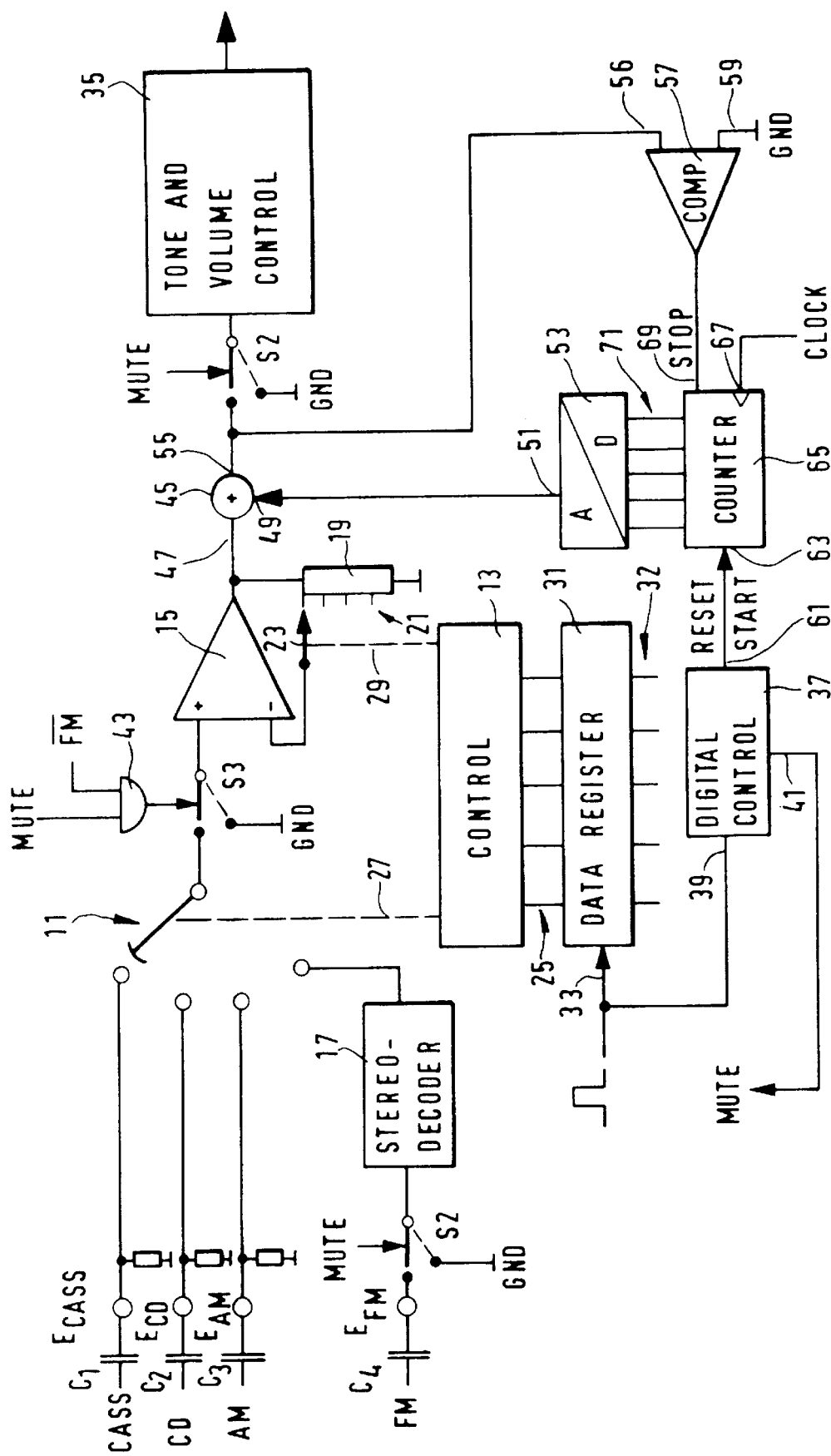

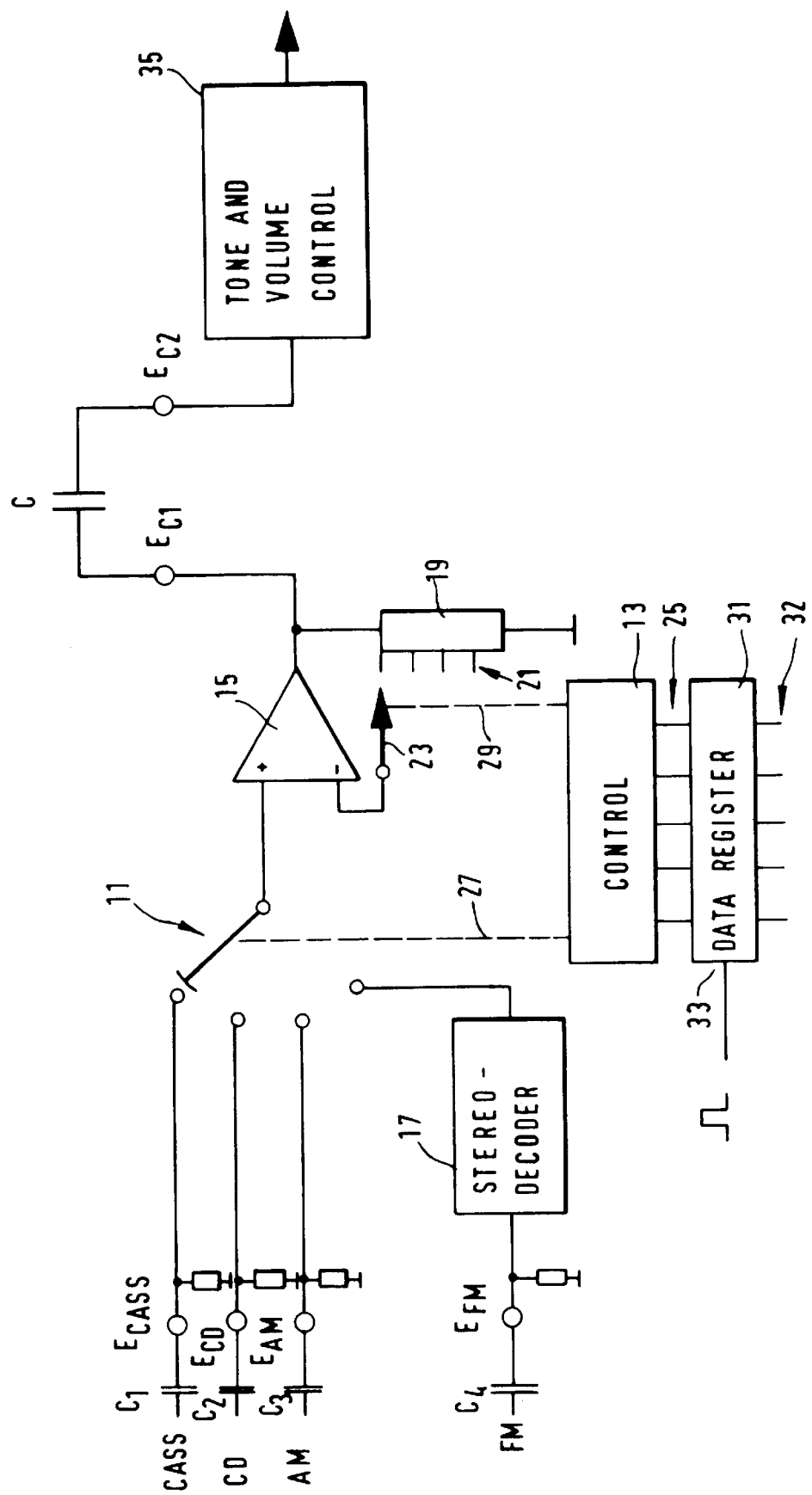

METHOD AND APPARATUS FOR OFFSET COMPENSATION OF A SIGNAL PROCESSING CIRCUIT

TECHNICAL FIELD

This invention relates generally to the field of circuitry for signal processing, and more particularly to a method and an apparatus for offset compensation of a signal processing circuit in whose signal path a circuit configuration with offset is located.

Such a signal processing circuit can be for example part of a radio whose audio signal processing circuit is connectable alternatively to one of several audio signal sources, which may be e.g., a stereo decoder, an AM signal source, a cassette recorder and a compact disc player.

BACKGROUND OF THE INVENTION

The degree of monolithic integration has progressed very far in the field of radios. Under the name TDA 7340, SGS-THOMSON has brought out a monolithic integrated circuit which performs the entire audio signal processing of a stereo radio. For its operation, this integrated circuit resorts to a number of external circuit components, predominantly capacitors which cannot be monolithically integrated, or only with very great effort. For connecting these external circuit components this integrated circuit requires an accordingly high number of terminal pins.

In the input area of such an audio signal processing circuit, which includes a circuit device for selecting one of the signal sources and a signal amplifier with adjustable gain, there are circuit components with offset, namely the stereo decoder and an operational amplifier. This operational amplifier is followed by a circuit configuration for tone and volume control of the signal amplified by the operational amplifier. In the now customary way one uses, both for the gain adjustment of the operational amplifier and for the tone and volume adjustment by means of the following tone and volume control circuit, voltage dividers to be adjusted by means of digital control signals in the form of resistor strings with a plurality of component voltage taps. Unlike the formerly used potentiometers, such voltage dividers involve no continuous adjustability, but rather quantum adjustability. When such voltage dividers are supplied audio signals superimposed by a dc component due to previous circuit configurations with offset, this component is also stepped down in quanta by the digitally controllable voltage dividers. Upon a change of adjustment of such a voltage divider, this results in an audible click of the loudspeaker of a radio equipped with such an audio signal processing circuit.

In the known audio signal processing circuit, this problem has been overcome by connecting a capacitor in series between the output of the operational amplifier whose signal input is connected with the selected signal source, and the following tone and volume control circuit, thereby obtaining a dc decoupling and thus an elimination of the offset dc component.

By a multiplicity of measures the applicant has succeeded in providing a new monolithic integrated circuit for audio signal processing which manages with considerably fewer external circuit components than hitherto necessary, which has led to a saving of 24 terminal pins over the integrated circuit TDA 7340. This entails a considerable cost saving, on the one hand because a simpler housing can be used for the integrated circuit, and on the other hand because so many external circuit components can be dispensed with.

In the course of realizing this new integrated circuit, the desire arose to do without the external capacitor used for suppressing the offset voltage in the known signal processing circuit. For a radio suitable for stereo reception and therefore having two signal processing channels, this means a saving of two external capacitors and four terminal pins of the integrated signal processing circuit.

The present invention was therefore intended to eliminate the necessity of such external capacitors and the terminal pins required therefor and thus provide an offset compensating method which need not resort to external circuit components.

SUMMARY OF THE INVENTION

The invention provides a method for offset compensation of a signal processing circuit in whose signal path a circuit configuration with offset is located, wherein the circuit configuration with offset is temporarily decoupled from the signal path of the signal processing circuit and meanwhile held strictly in a dc mode, a compensating dc voltage is added to the output dc voltage occurring at the output of the circuit configuration with offset in the dc mode, said compensating dc voltage being varied until the cumulative value of output dc voltage and compensating dc voltage has become zero, the circuit configuration with offset is then coupled into the signal path again, and from then on the compensating dc voltage occurring at the cumulative value zero is permanently added to the output signal of the circuit configuration with offset until a new offset compensating process is performed.

An inventive signal processing circuit in whose signal path a circuit configuration with offset is located includes the following for offset compensation:

a switch device for switching the circuit configuration with offset temporarily into a compensation operating state in which it is decoupled from the signal path of the signal processing circuit and held strictly in a dc mode;

an adding device for adding an offset compensating voltage to the output voltage of the circuit configuration with offset;

a zero voltage detector for monitoring the output voltage of the adding device for the occurrence of a zero voltage;

a compensating voltage source to be switched at the beginning of an offset compensating process first into a first operating state in which it gives out a rising or falling compensating direct voltage, and then into a second operating state in which it constantly supplies the compensating direct voltage reached at the time it left the first operating state;

and a compensating control circuit for controlling the switching state of the switch device and switching the compensating voltage source into its first operating state at the beginning of an offset compensating process;

the compensating voltage source being switched into its second operating state upon detection of a zero voltage at the output of the adding device by the zero voltage detector.

In a preferred embodiment of the inventive signal processing circuit, a first controllable switch is disposed in the signal path of the signal processing circuit before the circuit configuration with offset, and a second controllable switch after the circuit configuration with offset, and the adding device is disposed between the circuit configuration with offset and the second controllable switch. The two switches supply to the particular following circuit device the signal to be processed in a first switching state and a zero or ground potential in a second switching state. The adder device can comprise a first adder input coupled with the output of the circuit configuration with offset, a second adder input coupled with a compensating voltage output of the compensating voltage source, and an adder output coupled with the second switch, on the one hand, and with an input of the zero voltage detector, on the other hand.

The control circuit can be switched by an offset compensating command signal into an offset compensating operation in which it switches the two controllable switches into a switching state interrupting the signal path in each case and the compensating voltage source into its first operating state. Upon detection of a zero voltage at the adder output the zero voltage detector can produce a stop signal, which causes the compensating voltage source to be switched into its second operating state and the two controllable switches into a switching state conducting the signal.

If one has an audio signal processing circuit with a stereo decoder with offset, one disposes the first controllable switch in the signal path before the stereo decoder.

In an audio signal processing circuit having a signal source selection circuit for connecting with a signal input of the signal amplifier one of a number of different audio signal sources including at least one signal source with offset, such as the stereo decoder, and signal sources without offset, for example input connections for a cassette recorder, a compact disc player and an AM signal source, the switch device can have a third controllable switch disposed in the signal path between the signal source selection circuit and the signal input of the signal amplifier and supplying to the signal input of the signal amplifier the signal to be processed in a first switching state and the ground potential in a second switching state, the third switch being switched into the first switching state during an offset compensating process when the signal source selection circuit connects the signal input of the signal amplifier with the signal source with offset, and being switched into the second switching state when the signal source selection circuit connects the signal input of the signal amplifier with a signal source without offset.

The compensating voltage source can have a counter subject to counting clocks which is adjusted to a predetermined initial count number at the beginning of an offset compensating process, and whose count number is varied by the counting of the counting clocks during the first operating state of the compensating voltage source and held at the count number reached at the time it left the first operating state during the second operating state of the compensating voltage source. In this case, the compensating voltage source furthermore has a digital-to-analog converter for converting the particular count of the counter into an analog compensating dc voltage.

The compensating control circuit can have a control signal input which is supplied a signal source selection signal which causes the compensating control circuit to control essentially simultaneously a switchover of the switch device into its switching state intended for an offset compensating process, and of the compensating direct voltage source into its first operating state.

The signal source selection signal supplied to the signal source selection circuit for switching over the signal source is preferably supplied simultaneously to the control signal input of the compensating control circuit, so that the switchover of the circuit into an offset compensating process takes place automatically at each signal source switchover.

The compensating control circuit can have a data register for storing a data word determining the particular desired signal source, said data word serving to maintain the desired signal source selection until a new data word is read into the data register. Furthermore the control device can set the counter at the predetermined initial count upon reception of a data word. The counter can have a stop signal input which is supplied the stop signal from the zero voltage detector, and the counter can thereby be designed to stop at the count number reached upon reception of the stop signal until the counter is reset to its initial count number by the control device.

The control device can have a stop signal input which is supplied the stop signal from the zero voltage detector, and it can be designed to switch the switch device into the signal-conducting state upon reception of the stop signal. In this case, the signal processing circuit is switched from the offset compensating process back into the normal signal processing state as soon as the zero voltage detector detects during the offset compensating process that the direct voltage at the adder output has become zero.

However, one can also design the control circuit to hold the signal processing circuit in the offset compensating state for a predetermined time when an offset compensating process is triggered, and then switch the signal processing circuit back into its signal processing state, independently of an output signal from the zero voltage detector. Since a fixed period of time within which the offset compensation is definitely reached must be given for the offset compensating process in this case, it may be advantageous to make the switchback of the signal processing circuit from the offset compensating state into the normal signal processing state dependent on the output signal from the zero voltage detector.

If one uses the inventive signal processing circuit for an audio signal processing circuit of the abovementioned kind, wherein a signal input of a signal amplifier is connectable selectively with one of several signal sources, an interruption in audio signal processing occurs temporarily upon a switchover between two signal sources, during which the signal processing circuit is usually switched into a mute state in order to avoid switchover sounds in the loudspeaker output signal. The inventive offset compensation is performed during this already present mute state, so that the offset compensating process is not at all noticeable to the user of the audio device.

Since the compensating process reached at the end of an offset compensating state is maintained until the particular selected signal source is left, it suffices to perform the offset compensating processes during the signal source switchover processes.

Since this offset compensation takes place within the monolithic integrated signal processing circuit, i.e., without resorting to external circuit components, one no longer requires the two capacitors and four terminal pins hitherto necessary.

BRIEF DESCRIPTION OF THE DRAWINGS

FIG. 1 shows a schematic circuit diagram of an embodiment of an inventive signal processing circuit.

FIG. 2 shows a schematic block diagram of a conventional signal processing line.

DETAILED DESCRIPTION OF THE INVENTION

The invention will now be explained more closely with reference to preferred embodiments.

First a conventional signal processing circuit will be considered with reference to FIG. 2. It has four inputs for four different audio signal sources, namely input CASS to be connected with a signal output of a cassette recorder, signal input CD to be connected with a signal output of a compact disc player, signal input AM connected with the output of an AM signal source (medium-wave and/or long-wave and/or short-wave receiving section), and input FM connected with an FM stereo receiving section (for VHF stereo radio reception). The monolithic integrated audio signal processing circuit has corresponding terminal pins $E_{CASS}$, $E_{CD}$, $E_{AM}$ or $E_{FM}$ for connecting the signal processing circuit to said signal sources. Between the signal sources and said terminal pins of the integrated circuit there are capacitors C1 to C4 which effect a direct voltage decoupling of said terminal pins from the corresponding signal sources, so that dc components possibly supplied by these signal sources are not transmitted to the terminal pins of the integrated signal processing circuit.

The signal processing circuit has a signal source selection circuit including selector switch 11, and control circuit 13 controlling the selection position of elector switch 11. Via selector switch 11, which is shown symbolically in FIG. 2 as a multistage changeover switch but is formed in practice by electronic switches, in particular in the form of switching transistors, signal input + of operational amplifier 15 is connectable in selectable fashion with one of the four terminal pins $E_{CASS}$ to $E_{FM}$ of the integrated signal processing circuit. Connected between selector switch 11 and terminal pin $E_{FM}$ is stereo decoder 17 at whose output an audio signal for one of two stereo channels is made available.

Operational amplifier 15 has a feedback circuit in which voltage divider 19 in the form of a resistor string with a number of component voltage taps 21 is located. Each of these component voltage taps is connected with feedback input—of operational amplifier 15 via electronic switch 23, of which only one is shown for simplicity's sake. In accordance with which one of electronic switches 23 is rendered conductive, the signal gain of operational amplifier 15 can be adjusted. This gain adjustment likewise takes place under the control of control circuit 13 which determines, in accordance with a digital control signal supplied thereto, which one of electronic switches 23 is to be conductive.

Control circuit 13 converts digital control data words supplied thereto via input connections 25 into selector signals for selector switch 11 or switch control signals for electronic switches 23. The control signal connections between control circuit 13 and selector switch 11, on the one hand, and electronic switches 23 are indicated in simplified fashion by one dashed line assembly 27, 29 in each case.

Control circuit 13 receives its control data words from data register 31 having data read-in lines 32 and read-in control input 33. Whenever another signal source is to be switched to, a data word belonging to this signal source is read into data register 31. This word remains stored in data register 31 until a control signal for selecting one of the signal sources is supplied to read-in control input 33 again. The data word stored in data register 31 contains, on the one hand, information on the switching position of selector switch 11 belonging to the selected signal device and, on the other hand, information on which one of electronic switches 23 is to be rendered conductive for the selected signal source. In this way one can assign to each signal source a certain signal gain through operational amplifier 15, for example in order to make the audio signal delivered by the output of operational amplifier 15 have a signal level which is essentially independent of which of the signal sources is selected at the moment. This avoids unpleasant volume jumps upon a switchover to another signal source.

The audio signal supplied by the output of operational amplifier 15 is further processed by tone and volume control circuit 35 for adjusting the tone and trebles and basses of the audio signal.

Both stereo decoder 17 and operational amplifier 15 have offset, i.e., produce an undesirable dc component which is superimposed on the audio signal supplied thereby. As mentioned above, such a dc component would lead to an audible click in the sound signal emitted by the loudspeakers upon a change of tone and/or volume adjustment. For this reason, external capacitor C is connected between the output of operational amplifier 15 and the input of tone and volume control circuit 35, and connected with the integrated audio signal processing circuit via terminal pins $E_{C1}$ and $E_{C2}$.

As mentioned above, capacitor C and terminal pins $E_{C1}$ and $E_{C2}$ are to be rendered superfluous without permitting the offset behavior of stereo decoder 17 and/or operational amplifier 15 to take effect in the following signal processing circuits.

This is obtained with the embodiment of an inventive signal processing circuit shown in FIG. 1. It includes all circuit components of the known signal processing circuit shown in FIG. 2, with the exception of capacitor C and the two terminal pins $E_{C1}$ and $E_{C2}$. Circuit components in which the signal processing circuit shown in FIG. 1 matches the signal processing circuit shown in FIG. 2 are provided with the same reference signs as in FIG. 2 and have the same function, which will not be explained again in connection with FIG. 1.

In addition to the circuit components shown in FIG. 2, the signal processing circuit shown in FIG. 1 has first controllable switch S1 disposed in the signal path between terminal pin $E_{FM}$ and stereo decoder 17, second controllable switch S2 connected into the signal path between the output of operational amplifier 15 and the input of tone and volume control circuit 35, and third controllable switch S3 connected into the signal path between selector switch 11 and the signal input of operational amplifier 15. Each of these three switches S1 to S3 is formed by an electronic switch which is conductive for the audio signal to be processed in a first switching state, which is shown in FIG. 1 by means of a continuous thick line, and nonconductive for the audio signal to be processed in a second switching state, which is shown by a dashed line in FIG. 1. Switches S1 to S3 are controlled by digital control device 37 having control signal input 39 and control signal output 41. Whenever a switchover from the adjusted signal source to another signal source is to take place, control signal input 39 is supplied a control signal which causes a MUTE signal to be delivered at control signal output 41. The MUTE signal causes the signal processing circuit to be switched mute during the signal source switchover process, on the one hand, and switches S1 and S2 to be switched over into the switching state in which they are nonconductive for the audio signal, on the other hand. In this switching state, switches S1 and S2 each form connections to ground connection GND.

The gate of switch S3 is supplied the MUTE signal not directly but via a first input of AND circuit 43 having a second input which is supplied signal ⁻FM⁻. Signal ⁻FM⁻ is such that it makes AND circuit 43 conductive for the MUTE signal only when selector switch 11 is connected with a signal source other than stereo decoder 17. This causes signal input + of operational amplifier 15 to remain connected with selector switch 11 when stereo decoder 17 is selected as a signal source despite the occurrence of a MUTE signal, and signal input + of operational amplifier 15 to be connected with ground GND when a signal source other than stereo decoder 17 is selected.

Connected between the output of operational amplifier 15 and second switch S2 is adding circuit 45 having first input 47 connected with the output of operational amplifier 15, and having second input 49 connected with analog voltage output 51 of analog-to-digital converter (A-D converter) 53. Adder output 55 is connected with second switch S2, on the one hand, and with first comparator input 56 of comparator 57, on the other hand. Second input 59 of comparator 57 is connected with ground GND.

Digital control device 37 has counter control output 61 connected with counter control input 63 of counter 65, which is supplied counting clock signal CLOCK via counting input 67. The counter further has stop signal input 69 connected with an output of comparator 57. A-D converter 53 and counter 65 are interconnected via count number lines 71 for delivering the particular count number assumed by counter 65 in digital fashion to A-D converter 53, which produces therefrom an analog voltage corresponding to the particular count number and supplies it as offset compensating voltage to second input 49 of adding circuit 45.

The mode of operation of the signal processing circuit shown in FIG. 1 will now be considered.

It is first assumed that the audio signal processing circuit is to be switched to the compact disc player as the signal source. In order to do so, the user of the radio provided with the signal processing circuit of FIG. 1 operates a selection button (not shown). This causes a data word to be read into data register 31, driving selector switch 11 into connection with terminal pin $E_{CD}$, on the one hand, and controlling a certain gain of operational amplifier 15, on the other hand. The instruction to switch over to another signal source is furthermore registered by digital control device 37 which thereupon delivers a MUTE signal. This switches the radio mute, on the one hand, and switches over switches S1 and S2 to their mass connections GND, on the other hand. Since selector switch 11 is not connected with stereo decoder 17, a signal rendering AND circuit 43 conductive for the MUTE signal reaches input ⎺FM⎺ of AND circuit 43, so that signal input + of operational amplifier 15 is connected with ground connection GND of switch S3. Operational amplifier 15 is thus coupled out of the audio signal path. However, it remains in operation in terms of dc voltage.

Simultaneously with the release of the MUTE signal digital control device 37 sets counter 65 via its counter control input 63 at a predetermined initial count number, preferably an initial count number zero, and gives the counter a counting start signal, whereupon the counter begins to count the clock signal CLOCK supplied to its counting input 67. This causes A-D converter 53 to supply via its output 51 to second input 49 of adding circuit 45 a varying, namely increasing or decreasing, analog voltage which has the function of the offset compensating direct voltage. This analog voltage is added to or subtracted from the direct voltage at the output of operational amplifier 15, which is the offset voltage thereof. The direct voltage resulting at adder output 55 is monitored by comparator 57.

If one knows which sign the offset voltage produced by operational amplifier 15 has, one can let the counter count in a direction such that the analog voltage supplied by A-D converter 53 is a varying direct voltage having an opposite sign.

Assuming that operational amplifier 15 can have an offset voltage with a positive or negative sign, one can let the counter count from a predetermined initial count with a first sign beyond the count zero to count numbers with the opposite sign, so that the analog voltage supplied by A-D converter 53 runs from a predetermined dc voltage with a first sign beyond the dc voltage zero to dc voltages with the opposite sign.

As soon as comparator 57 detects a dc voltage zero at adder output 55, it supplies a stop signal via its output to counter 65, which causes counter 65 to stop counting and remain at its count reached up to then. From this time on, A-D converter 53 therefore delivers a constant offset compensating direct voltage to second input 49 of adder circuit 45, which leads to lasting compensation of the offset voltage of operational amplifier 15. This offset compensation is maintained unchanged until a new signal source switchover.

Switches S1 and S2 are switched back into their normal state in which they conduct the audio signal to be processed, either upon occurrence of the stop signal at the output of comparator 57 or through another control signal at the end of the signal source switchover process.

If stereo decoder 17 is selected as a signal source in a selection process, a binary signal reaches input ⎺FM⎺ of AND circuit 43 to block AND circuit 43 for the MUTE signal, so that only switches S1 and S2 are switched over to their ground connection GND while switch S3 remains in the state in which it connects signal input + of operational amplifier 15 with selector switch 11. In this case, stereo decoder 17 and operational amplifier 15 are therefore in a series connection which is coupled out of the signal path altogether due to the switchover of S1 and S2. At the output of operational amplifier 15 a direct voltage therefore arises which results from a summation of the offset voltages of stereo decoder 17 and operational amplifier 15. During the offset compensating process triggered by the switchover of selector switch 11 stereo decoder 17, the counting process of counter 65 is therefore performed until the corresponding compensating direct voltage supplied by A-D converter 53 has reached a value such that it compensates both the offset voltage of stereo decoder 17 and the offset voltage of operational amplifier 15. When all three switches S1 to S3 are in the signal-conducting state again after the end of this offset compensating process, the audio signal occurring at adder output 45 is compensated both with respect to the offset voltage of stereo decoder 17 and with respect to the offset voltage of operational amplifier 15.

What is claimed is:

1. An electric signal processing circuit in whose signal path a circuit configuration with offset is located wherein the following are provided for offset compensation:

a) a switch device for switching the circuit configuration with offset temporarily into a compensation operating state in which it is decoupled from the signal path of the signal processing circuit and held strictly in a dc mode;

b) an adding device for adding an offset compensating voltage to the output voltage of the circuit configuration with offset;

c) a zero voltage detector for monitoring the output voltage of the adding device for the occurrence of a zero voltage;

d) a compensating voltage source which is switched at the beginning of an offset compensating process first into a first operating state in which it gives out a rising or falling compensating direct voltage, and then into a second operating state in which it constantly supplies the compensating direct voltage reached at the time it left the first operating state;

e) and a compensating control circuit for controlling the switching state of the switch device and switching the compensating voltage source into its first operating state at the beginning of an offset compensating process;

f) the compensating voltage source being switched into its second operating state upon detection of a zero voltage at the output of the adding device by the zero voltage detector, wherein a first controllable switch is disposed in the signal path of the signal processing circuit before the circuit configuration with offset, and a second controllable switch after the circuit configuration with offset.

2. An electric signal processing circuit in whose signal path a circuit configuration with offset is located wherein the following are provided for offset compensation:

a) a switch device for switching the circuit configuration with offset temporarily into a compensation operating state in which it is decoupled from the signal path of the signal processing circuit and held strictly in a dc mode;

b) an adding device for adding an offset compensating voltage to the output voltage of the circuit configuration with offset;

c) a zero voltage detector for monitoring the output voltage of the adding device for the occurrence of a zero voltage;

d) a compensating voltage source which is switched at the beginning of an offset compensating process first into a first operating state in which it gives out a rising or falling compensating direct voltage, and then into a second operating state in which it constantly supplies the compensating direct voltage reached at the time it left the first operating state;

e) and a compensating control circuit for controlling the switching state of the switch device and switching the compensating voltage source into its first operating state at the beginning of an offset compensating process;

f) the compensating voltage source being switched into its second operating state upon detection of a zero voltage at the output of the adding device by the zero voltage detector, wherein a first controllable switch is disposed in the signal path of the signal processing circuit before the circuit configuration with offset, and a second controllable switch after the circuit configuration with offset, and the adding device is disposed between the circuit configuration with offset and the second controllable switch, the two switches supplying to the particular following circuit device the signal to be processed in a first switching state and a zero potential, such as ground potential, in a second switching state.

3. The signal processing circuit of claim 2 wherein the adding device comprises:

a) a first adder input coupled with the output of the circuit configuration with offset, b) a second adder input coupled with a compensating voltage output of the compensating voltage source, and c) an adder output coupled with the second switch, on the one hand, and with an input of the zero voltage detector, on the other hand.

4. The signal processing circuit of claim 2 wherein a) the compensating control circuit is switched by an offset compensating command signal into an offset compensating operation in which it switches the two controllable switches into their second switching state and the compensating voltage source into its first operating state, and b) the zero voltage detector, upon detection of a zero voltage at the adder output, produces a stop signal which causes the compensating voltage source to switch into its second operating state and the two controllable switches into their first switching state.

5. The signal processing circuit of claim 2, which is formed as audio signal processing circuit and has a series connection with a stereo decoder with offset and a signal amplifier with offset, this series connection being disposed between the first controllable switch and the adding device.

6. The signal processing circuit of claim 5, having a signal source selection circuit for connecting with a signal input of the signal amplifier one of a number of different audio signal sources including at least one signal source with offset, such as the stereo decoder, and signal sources without offset, for example input connections for a cassette recorder, a compact disc player and an AM signal source, the switch device having a third controllable switch disposed in the signal path between the signal source selection circuit and the signal input of the signal amplifier, and supplying to the signal input of the signal amplifier the signal to be processed in a first switching state and the zero potential in a second switching state, the third switch being switched into the first switching state during an offset compensating process when the signal source selection circuit connects the signal input of the signal amplifier with a signal source with offset, and being switched into the second switching state when the signal source selection circuit connects the signal input of the signal amplifier with a signal source without offset.

7. The signal processing circuit of claim 2 wherein the compensating voltage source comprises:

a) a counter subject to counting clocks which is adjusted at the beginning of an offset compensating process at a predetermined initial count number, and whose count number is varied by the counting of the counting clocks during the first operating state of the compensating voltage source and held at the count number reached at the time it left the first operating state during the second operating state of the compensating voltage source, and b) a digital-to-analog converter for converting the particular count of the counter into an analog compensating dc voltage.

8. The signal processing circuit of claim 6 wherein the compensating control circuit has a control signal input which is supplied simultaneously with the signal source selection circuit a signal source switchover control signal serving to switch over the signal source, the signal source switchover control signal causing the compensating control circuit to control essentially simultaneously a switchover of a) the switch device into its switching state intended for an offset compensating process b) and the compensating direct voltage source into its first operating state.

9. The signal processing circuit of claim 8 wherein a data register is provided for storing a data word belonging to the selected signal source upon reception of the signal source switchover control signal, said data word serving to maintain the particular signal source selection until a new data word is read into the data register.

10. The signal processing circuit of claim 7 wherein the counter has a stop signal input which is supplied the stop signal from the zero voltage detector, and the counter is designed to stop at the count number reached upon reception of the stop signal until the counter is reset to its initial count number by the control device.

11. The signal processing circuit of claim 10 wherein the control device has a stop signal input which is supplied the stop signal from the zero voltage detector, and the control device is designed to switch the switch device into the signal-conducting switching state upon reception of the stop signal.

12. A method for providing offset compensation of a signal processing circuit having a signal path including a circuit configuration with offset, the method comprising the steps of:

temporarily decoupling the circuit configuration with offset from the signal path of the signal processing circuit;

holding the circuit configuration with offset in a dc mode while the circuit device with offset is temporarily decoupled;

adding a compensating dc voltage to an output dc voltage at an output of the circuit configuration with offset;

varying the compensating dc voltage such that a cumulative value of the output dc voltage and the compensating dc voltage is substantially equal to zero; and coupling the circuit configuration with offset to the signal path of the signal processing circuit when the cumulative value of the output dc voltage and the compensating dc voltage is substantially equal to zero.

13. An electric signal processing circuit having a signal path including a circuit configuration with offset, the electrical signal processing circuit comprising:

a switch device having a first state in which the circuit configuration with offset is coupled to the signal path of the signal processing circuit and a second state in which the circuit configuration with offset is temporarily decoupled from the signal path of the signal processing circuit;

an adding device having an output, the adding device summing an offset compensating voltage through the output of the adding device into an output voltage of the circuit configuration with offset;

a zero voltage detector, the zero voltage detector adapted to detect when the compensating voltage at the output of the adding device is equal to zero;

a compensating voltage source having a first operating state in which the compensating voltage source supplies one of either a rising or a falling compensating direct voltage, and a second operating state in which the compensating voltage source supplies a constant compensating direct voltage equal in value to value of the compensating direct voltage just prior to leaving the first operating state;

a compensating control circuit, the compensating control circuit adapted to switch the state of the switch device between the first state of the switch device when the compensating voltage at the output of the adding device is zero and the second state of the switch device when a new signal source is selected, and the compensating control circuit being further adapted to switch the state of the compensating voltage source between the first operating state of the compensating voltage source when the new signal source is selected and into the second operating state of the compensating voltage source when the compensating voltage at the output of the adding device is zero, wherein a first controllable switch is disposed in the signal path of the signal processing circuit before the circuit configuration with offset, and a second controllable switch after the circuit configuration with offset.

14. An electric signal processing circuit having a signal path including a circuit configuration with offset, the electrical signal processing circuit comprising:

a switch device having a first state in which the circuit configuration with offset is coupled to the signal path of the signal processing circuit and a second state in which the circuit configuration with offset is temporarily decoupled from the signal path of the signal processing circuit;

an adding device having an output, the adding device summing an offset compensating voltage through the output of the adding device into an output voltage of the circuit configuration with offset;

a zero voltage detector, the zero voltage detector adapted to detect when the compensating voltage at the output of the adding device is equal to zero;

a compensating voltage source having a first operating state in which the compensating voltage source supplies one of either a rising or a falling compensating direct voltage, and a second operating state in which the compensating voltage source supplies a constant compensating direct voltage equal in value to value of the compensating direct voltage just prior to leaving the first operating state;

a compensating control circuit, the compensating control circuit adapted to switch the state of the switch device between the first state of the switch device when the compensating voltage at the output of the adding device is zero and the second state of the switch device when a new signal source is selected, and the compensating control circuit being further adapted to switch the state of the compensating voltage source between the first operating state of the compensating voltage source when the new signal source is selected and into the second operating state of the compensating voltage source when the compensating voltage at the output of the adding device is zero, wherein the switch device comprises:

a first controllable switch disposed in the signal path of the signal processing circuit relatively before the circuit configuration with offset with respect to a direction of signal flow;

a second controllable switch disposed in the signal path of the signal processing circuit relatively after the circuit configuration with offset with respect to the direction of signal flow; and, wherein the adding device is disposed between the circuit configuration with offset and the second controllable switch, the first controllable switch and the second controllable switch each supplying to a following circuit device the signal to be processed in the first state and a zero potential in the second state.

15. The electric signal processing circuit of claim 14, wherein the adding device comprises:

a first adder input coupled with the output of the circuit configuration with offset, a second adder input coupled with a compensating voltage output of the compensating voltage source, and wherein the output of the adding device is coupled with the second controllable switch, and with an input of the zero voltage detector.

16. The electric signal processing circuit of claim 15, further comprising a signal source selection circuit for connecting with a signal input of a signal amplifier one of a number of different audio signal sources including at least one signal source with offset, and at least one signal source without offset, and wherein the switch device further comprises a third controllable switch having a first state when the signal source selection circuit connects the signal input of the signal amplifier with a signal source with offset and a second state when the signal source selection circuit connects the signal input of the signal amplifier with a signal source without offset, the third controllable switch disposed in the signal path between the signal source selection circuit and the signal input of the signal amplifier such that the third controllable switch supplies a signal to be processed to the signal input of the signal amplifier in the first switching state and the zero potential to the signal input of the signal amplifier in the second switching state.

17. The electric signal processing circuit of claim 16, wherein the compensating voltage source comprises:

a counter coupled to a clock for generating a count, the counter adapted to adjust the count to a predetermined initial count number when the new signal source is selected, vary the count while the compensating voltage source is in the first operating state of the compensating voltage source and hold the count equal to the count just prior to leaving the first operating state while the compensating voltage source is in the second state of the compensating voltage source, and a digital-to-analog converter coupled to the counter and adapted to convert the count of the counter into the compensating dc voltage.

* * * * *